(12) United States Patent
Wang et al.

(10) Patent No.: US 6,903,441 B2
(45) Date of Patent: Jun. 7, 2005

(54) SEMICONDUCTOR PACKAGE WITH ENHANCED CHIP GROUNDABILITY AND METHOD OF FABRICATING THE SAME

(75) Inventors: Chin Fa Wang, Tai-Ping (TW); Wen-Ta Tsai, Taichung (TW); Yuan-Ping Joe, Taichung (TW)

(73) Assignee: Siliconware Precision Industries, Ltd. (TW)

( * ) Notice: Subject to any disclaimer, the term of this patent is extended or adjusted under 35 U.S.C. 154(b) by 0 days.

(21) Appl. No.: 10/452,566

(22) Filed: May 30, 2003

(65) Prior Publication Data

US 2004/0070087 A1 Apr. 15, 2004

(30) Foreign Application Priority Data

Oct. 11, 2002 (TW) .................................... 91123407 A

(51) Int. Cl.[7] .................. H01L 23/498; H01L 21/58
(52) U.S. Cl. .................. 257/620; 257/783; 257/787; 438/113; 438/126
(58) Field of Search ........................ 257/620, 738, 257/783, 784, 787, E23.061, E23.066, E23.067, E23.069; 438/126, 617, 113

(56) References Cited

U.S. PATENT DOCUMENTS

| | | | |
|---|---|---|---|
| 5,508,556 A | * | 4/1996 | Lin ............................ 257/691 |
| 5,581,122 A | | 12/1996 | Chao et al. |
| 5,990,566 A | * | 11/1999 | Farnworth et al. .......... 257/783 |
| 6,316,287 B1 | | 11/2001 | Zandman et al. |
| 6,586,280 B2 | * | 7/2003 | Cheah ......................... 438/122 |
| 2002/0041027 A1 | * | 4/2002 | Sugizaki ..................... 257/737 |

* cited by examiner

Primary Examiner—Stephen W. Smoot
(74) Attorney, Agent, or Firm—Mikio Ishimaru

(57) ABSTRACT

A semiconductor package and a fabrication method thereof are provided, in which a ground pad on a chip is electrically connected to a ground plane on a substrate by means of an electrically-conductive wall formed over a side surface of the chip and an electrically-conductive adhesive used for attaching the chip to the substrate. Therefore, a wire-bonding process is merely implemented for power pads and signal I/O (input/output) pads on the chip without having to form ground wires on the ground pads for electrical connection purposes. This benefit allows the use of a reduced number of bonding wires and simplifies wire arrangement or routability. And, a grounding path from the chip through the electrically-conductive wall and electrically-conductive adhesive to the substrate is shorter than the conventional one of using ground wires, thereby reducing a ground-bouncing effect and improving electrical performances of the semiconductor package.

19 Claims, 4 Drawing Sheets

SEMICONDUCTOR PACKAGE WITH ENHANCED CHIP GROUNDABILITY AND METHOD OF FABRICATING THE SAME

BACKGROUND OF THE INVENTION

1. Field of the Invention:

This invention relates to semiconductor packaging technology, and more particularly, to a semiconductor package with enhanced chip groundability and method of fabricating the same.

2. Description of Related Art:

Wire-bonding (WB) technology is a widely-used electrical connecting method in chip-packaging processes, which is used to electrically connect an array of pads on the chip, including ground pads, power pads, and signal I/O pads by means of bonding wires to corresponding connecting points on a substrate, so as to allow the internal circuitry of the packaged chip to be electrically connected to external printed circuit board.

One drawback to the conventional electrical connection between a chip and a substrate via bonding wires, however, is that wire routablity would be a problem, particularly in the case of the chip having a great number of densely-arranged ground/power and I/O pads to be electrically connected to the substrate. Moreover, as the chip is increased in the number of pads, it would require an increased number of bond wires, which are typically made of gold would result in high fabrication cost.

Moreover, by conventional methods, the wire-bonding process would make the total grounding path somewhat lengthy. Since this grounding path is considerably lengthy, it would result in the so-called ground-bouncing effect that would degrade the electrical performance of the package.

Related prior arts include, for example, U.S. Pat. No. 6,316,287, and U.S. Pat. No. 5,581,122, to name just a few.

U.S. Pat. No. 6,316,287 "CHIP SCALE SURFACE MOUNT PACKAGES FOR SEMICONDUCTOR DEVICE AND PROCESS OF FABRICATING THE SAME", which discloses a packaging method that is characterized by extending the ground pads on the packaged chip and expose the back sides thereof and then forming a metallization layer to electrically connect the exposed back sides to the grounding plane on the substrate. One drawback to this invention, however, is that it would require complex procedural steps to implement.

U.S. Pat. No. 5,581,122 "PACKAGING ASSEMBLY WITH CONSOLIDATED COMMON VOLTAGE CONNECTIONS FOR INTEGRATED CIRCUITS", which discloses a packaging method that is characterized by the use of a ground ring and a power ring to facilitate the electrically connecting of the chip's ground pads and power pads to the substrate. One drawback to this invention, however, is that the crossed arrangement of the ground ring and the power ring would make the fabrication process more complex and thus difficult to implement. Moreover, this patent nonetheless requires the use of ground wires for ground connection so that the grounding path is still considerably lengthy that would result in the above-mentioned ground-bouncing effect and thus degrade the electrical performance of the package.

SUMMARY OF THE INVENTION

It is therefore an objective of this invention to provide a packaging method for packaging a semiconductor chip with enhanced wire routability for non-grounding wires to make the overall packaging process more simplified to implement.

It is another objective of this invention to provide a packaging method for packaging a semiconductor chip that can reduce the total number of bond wires required in the wire-bonding process so as to reduce fabrication cost.

It is still another objective of this invention to provide a packaging method for packaging a semiconductor chip with enhanced wire routability for non-grounding wires, which can provide a shorter grounding path than prior art, so as to reduce the ground bouncing effect to ensure the electrical performance of the package.

The semiconductor package according to the invention comprises: a substrate having a front surface and a back surface; wherein the front surface is formed with at least one ground plane, while the back surface is formed with a plurality of ground-ball pads; and the substrate being further formed with a plurality of conductive vias for electrically connecting the grounding plane to the ground-ball pads; at least one semiconductor chip having an active surface and an inactive surface, wherein the active surface is formed with a plurality of ground pads thereon, with each ground pad being electrically connected to an conductive trace which is further electrically connected to an electrically-conductive wall on the side surface of the chip, while the inactive surface is adhered by means of an electrically-conductive adhesive to the front surface of the substrate in such a manner as to allow the electrically-conductive adhesive to come in contact with both the electrically-conductive wall and the ground plane on the substrate surface to thereby electrically interconnect the electrically-conductive wall with the grounding plane; an encapsulation body formed over the front surface for encapsulating the chip; and a plurality of solder balls implanted on the ground-ball pads over the back surface of the substrate, allowing the ground pads of the chip to be electrically connected to an external device such as printed circuit board (PCB) successively via the conductive trace, the electrically-conductive wall, the electrically-conductive adhesive, the grounding plan, the conductive vias, and the ground-ball pads, and an external device such as printed circuit board (PCB) so as to allow the chip to be externally grounded.

The invention is characterized by providing an electrically-conductive wall on the side surface of each chip for electrically connecting each ground pad on the chip to the grounding plane on the substrate. During subsequent wire-bonding process, since the ground pads on the chip have been already electrically connected to the substrate, the wire-bonding process can be applied only to power and I/O pads. Compared to the prior art, this benefit allows the use of a reduced number of bond wires and also allows the wire routability to be enhanced in wire routability, thereby reducing cost and making the packaging process more simplified to implement. Moreover, the invention allows the ground pads to be connected to the grounding plane on the substrate via a shorter path than prior art, since the length of the electrically-conductive wall is considerably shorter than a grounding wire. This benefit can reduce the ground-bouncing effect and thereby ensure the electrical performance of the package.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the semiconductor packaging technology according to the invention is disclosed in full details in the following with reference to FIG. 1 to FIG. 6.

Figure 1:
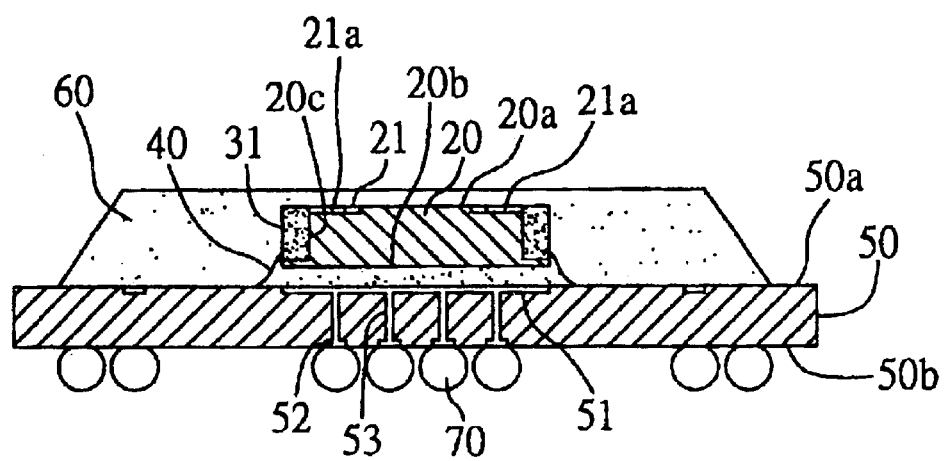
FIG. 1 is a schematic diagram showing a sectional view of the IC package according to the invention.

Referring to FIG. 1, at least one semiconductor chip 20 is mounted on a substrate 50 having a front surface 50a and a back surface 50b, wherein the front surface 50a is formed with at least one grounding plane 51, while the back surface 50b is provided with a plurality of ground-ball pads 52. In addition, the substrate 50 is formed with a plurality of conductive vias 53 for electrically connecting the grounding plane 51 to the ground-ball pads 52. Further, the chip 20 has an active surface 20a and an inactive surface 20b, wherein the active surface 20a is formed with a plurality of ground pads 21 which electrically connect via the conductive traces 21a to the edge of the chip 20 and then electrically connect the electrically-conductive wall 31. The inactive surface 20b of the chip 20 is adhered by means of an adhesive agent 40 over the front surface 50a of the substrate 50 with the adhesive agent 40 being in contact with both the electrically-conductive wall 31 and the grounding plane 51 on the substrate 50 for the purpose of electrically interconnecting the electrically-conductive wall 31 with the grounding plane 51. Further, an encapsulation body 60 is formed over the front surface 50a of the substrate 50 for the purpose of encapsulate the chip 20; and a plurality of ground balls 70 are implanted on the ground-ball pads 52, allowing the ground pads 21 on the chip 20 to be electrically connected via the conductive traces 21a, the electrically-conductive wall 31, the adhesive agent 40, the grounding plane 51, the conductive vias 53, and the ground-ball pads 52 to an external device such as printed circuit board (PCB, not shown) so as to allow the chip 20 to be externally grounded.

The fabrication process for the forgoing package is described in the following with reference to FIG. 2 through FIG. 6.

Figure 2A:
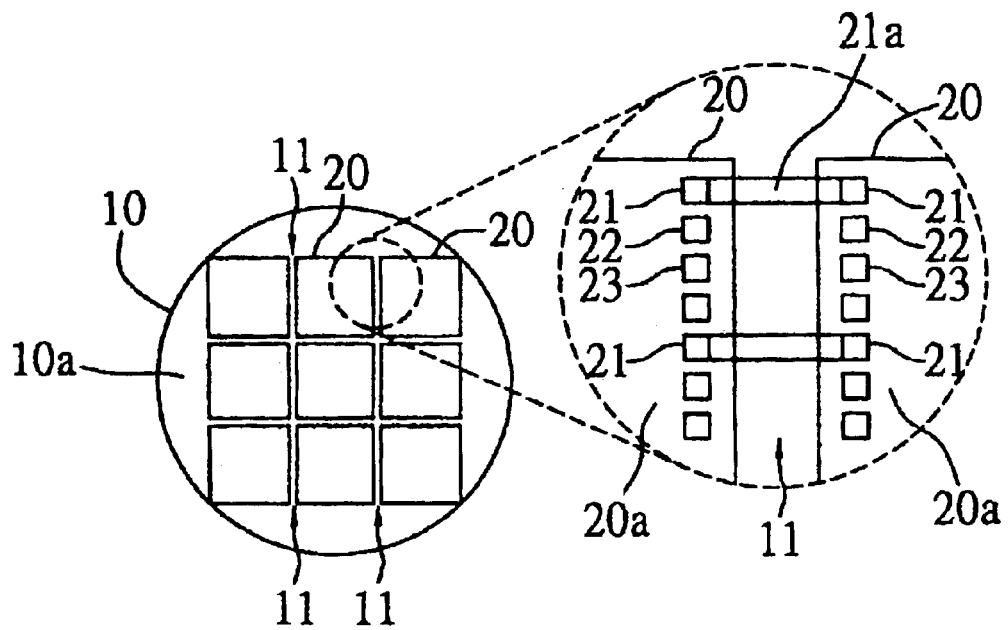
FIG. 2A is a schematic diagram showing a top view of a wafer prepared by the packaging method according to the invention.
Figure 2B:
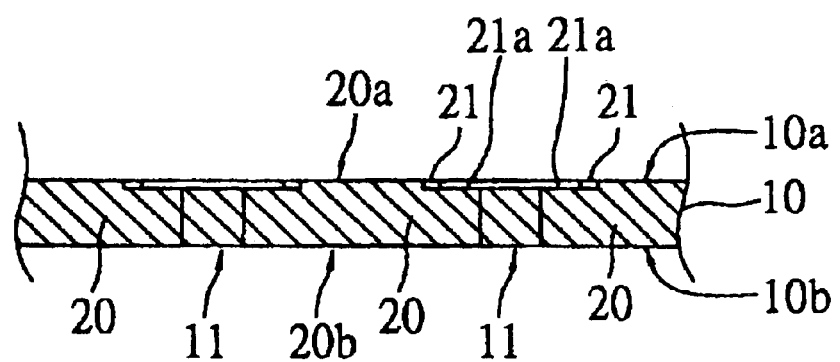
FIG. 2B is a schematic diagram showing-a sectional view of part of the wafer shown in FIG. 2A.

Referring to FIGS. 2A–2B, the first step of the packaging method according to the invention is to prepare a wafer 10, which has a front surface 10a and a back surface 10b, and which is partitioned by a number of predefined singulation lines 11 into a plurality of chips 20.

Each of the chips 20 in the wafer 10 has an active surface 20a on the front surface 10a of the wafer 10 and an inactive surface 20b on the back surface 10b of the wafer 10, and the front surface 10a of each chip 20 is formed with a plurality of pads, including ground pads 21, power pads 22, and signal I/O pads 23. In accordance with the invention, each of the ground pads 21 is formed with an elongated portion 21a extending across the singulation lines 11. In this embodiment, for instance, a continuous metallization layer is formed in such a manner as to cross the singulation lines 11 to interconnect each pair of opposite ground pads 21 on adjacent chips 20.

Figure 3:
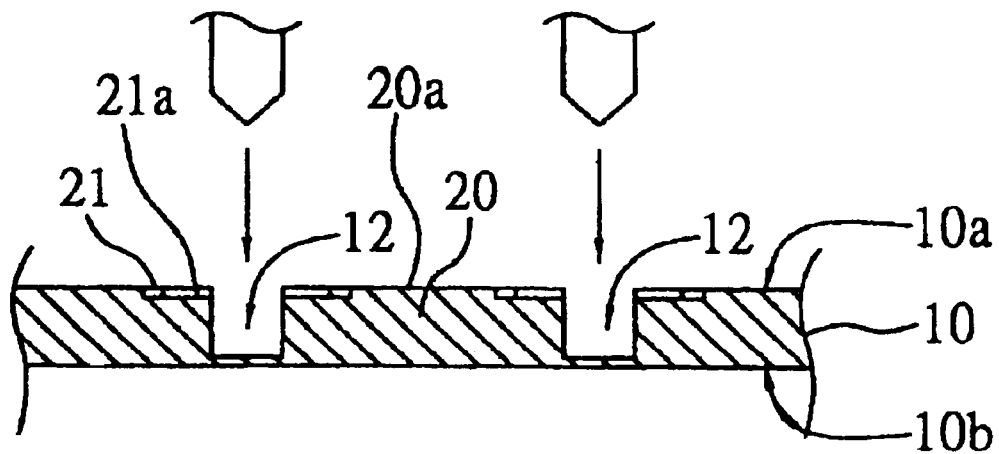
FIG. 3 is a schematic sectional diagram used to depict a first cutting procedure in the packaging method according to the invention.

Referring to FIG. 3, in the subsequent step, a first cutting process is performed to cut along the singulation lines 11 into the wafer 10 from the front surface 10a of the wafer 10 until reaching a depth of at least ½ of the thickness of the wafer 10, and preferably exceeding ⅔ of the thickness of the wafer 10, to thereby forming a plurality of trenches 12 along the singulation lines 11 on the front surface 10a of the wafer 10.

Figure 4:
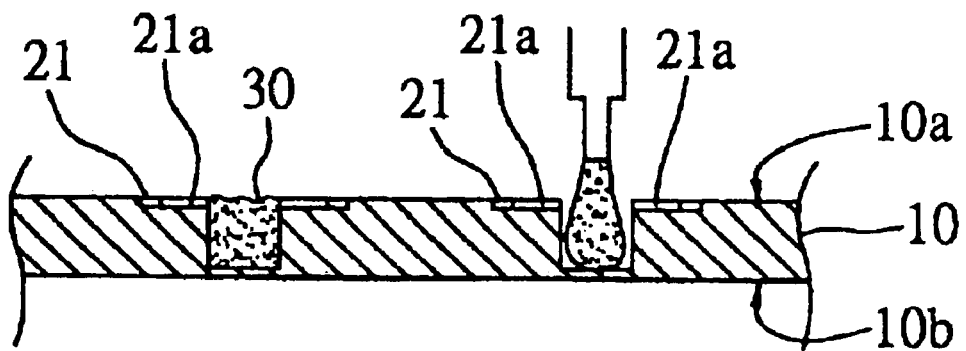
FIG. 4 is a schematic sectional diagram used to depict an electrically-conductive material fill process in the packaging method according to the invention.

Referring to FIG. 4, in the subsequent step, an electrically-conductive material is filled into the trenches 12 to form an electrically-conductive layer 30, wherein these electrically-conductive layers 30 are in electrical contact with the conductive traces 21a connected to the ground pads 21.

In this embodiment, for instance, the foregoing electrically-conductive material fill process includes a first step of performing a dispensing process to dispense a curable electrically-conductive material, such as silver paste, into the trenches 12; and then a second step of performing a baking process to cure the dispensed silver paste into solid form to serve as the desired electrically-conductive layers 30.

Figure 5:
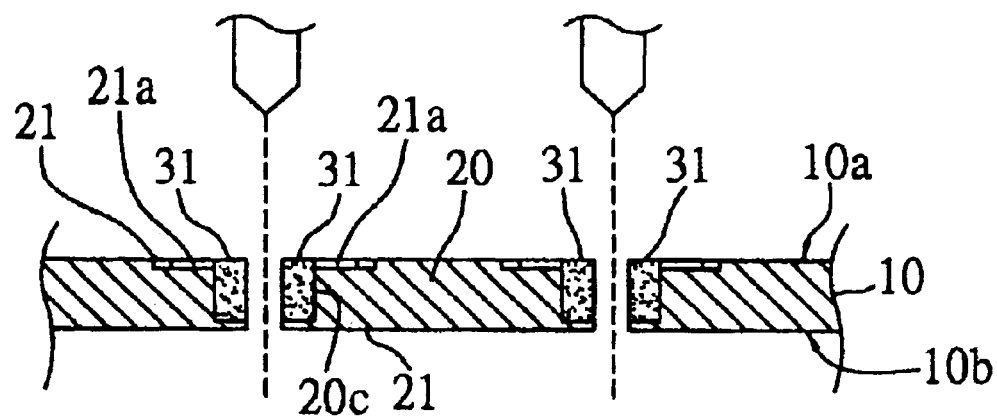
FIG. 5 is a schematic sectional diagram used to depict a second cutting procedure in the packaging method according to the invention.

Referring to FIG. 5, in the subsequent step, a second cutting process is performed to cut the electrically-conductive layers 30 along the singulation lines 11 so as to singulate each of the chips 20 from the wafer 10 and meanwhile cut each lined structure of each of the electrically-conductive layers 30 into two halved electrically-conductive walls 31 respectively attached to the side surfaces of adjacent chips 20 and electrically connected to the elongated portions 21a of the groundpads 21.

Figure 6:
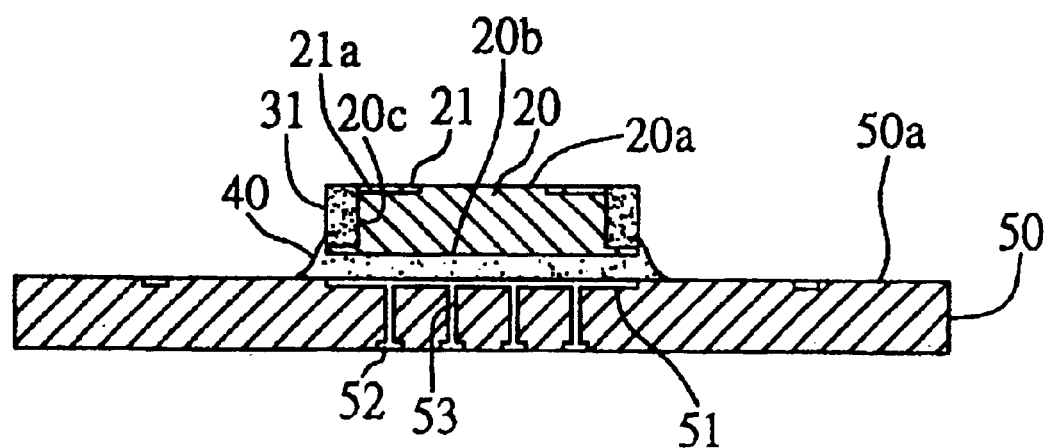
FIG. 6 is a schematic sectional diagram used to depict a die-mounting procedure in the packaging method according to the invention.

Referring to FIG. 6, in the subsequent step, a die-mounting process is performed to mount each singulated chip 20 on a substrate 50, in such a manner that the inactive surface 20b of the singulated chip 20 is attached by means of an electrically-conductive adhesive 40, such as silver paste, onto the substrate 50, with the electrically-conductive adhesive 40 being in electrical contact with both the electrically-conductive wall 31 on the side surface of the chip 20 and with the grounding plane 51 on the substrate 50. This allows each ground pad 21 on the active surface 20a of the chip 20 to be electrically connected successively via the elongated portion 21a, the electrically-conductive wall 31, and the electrically-conductive adhesive (silver paste) 40 to the grounding plane 51 of the substrate 50.

Referring back to FIG. 1, a molding process is performed to use an encapsulation material, such as epoxy resin, to form an encapsulation body 60 to encapsulate the chip 20. Finally, a ball-implantation process is performed to implant an array of solder balls 70 on the ground-ball pads 52 over the back surface 50b of the substrate 50, allowing the ground pads 21 on the chip 20 to be electrically connected via the conductive traces 21a, the electrically-conductive wall 31 on the side surface 20c, the adhesive agent 40 between the chip 20 and the substrate 50, the grounding plane 51 of the substrate 50, the conductive vias 53, and the ground-ball pads 52 to the external device (not shown) to allow the chip 20 to be externally grounded.

In conclusion, the invention provides a semiconductor packaging technology with enhanced groundability, which allows the ground pads 21 to be electrically connected to the grounding plane 51 on the substrate 50 via electrically-conductive wall 31 and adhesive agent 40, so that wire-bonding process needs just to be directed to the power pads 22 and the signal I/O pads 23 without having to apply wires to the ground pads 21 for grounding. Compared to the prior art, this feature can help reduce the difficulty of wire routability over the chip 20 and can reduce the number of wires to save fabrication cost.

Moreover, the invention allows the ground pads 21 to be connected to the grounding plane 51 on the substrate 50 via a shorter grounding path than prior art, since the length of the electrically-conductive wall 31 is substantially equal to the thickness of the chip 20, which is considerably shorter than a grounding wire that would be used by prior art to connect the ground pad 21 to the substrate 50. This feature allows the overall grounding path for each ground pad 21 to be shorter than prior art, and thus can substantially eliminate ground-bouncing effect and thereby allow the chip 20 to have more ensured electrical performance during operation than prior art. This benefit is particularly evident in the case of using a high-frequency operated chip. The finished semiconductor device is therefore more reliable to use than prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with enhanced chip groundability, comprising:
    a substrate having a front surface and a back surface, wherein the front surface is formed with at least one ground plane, the back surface is formed with a plurality of ground-ball pads, and a plurality of conductive vias are formed through the substrate for electrically connecting the ground around plane to the ground-ball pads;
    at least one semiconductor chip having an active surface and an inactive surface, wherein the active surface is formed with a plurality of conductive traces and a plurality of ground pads electrically connected to the conductive traces, allowing the ground pads to be connected via the conductive traces to an electrically-conductive wall formed on a side surface of the chip, and wherein the inactive surface is adhered by means of an electrically-conductive adhesive to the front surface of the substrate, allowing the electrically-conductive adhesive to come in contact with both the electrically-conductive wall and the ground plane of the substrate to thereby electrically interconnect the electrically-conductive wall with the ground plane;
    an encapsulation body formed over the front surface for encapsulating the chip; and
    a plurality of solder balls implanted on the ground-ball pads over the back surface of the substrate and electrically connected to an external device, so as to allow the ground pads of the chip to be electrically connected to an external device successively via the conductive traces, electrically-conductive wall, electrically-conductive adhesive, ground plane, conductive vias, ground-ball pads, and the solder balls.

2. The semiconductor package of claim 1, wherein the electrically-conductive wall is made of an electrically-conductive epoxy.

3. The semiconductor package of claim 1, wherein the electrically-conductive wall extends from an edge of the active surface over the side surface of the chip and has a depth equal to at least greater than one half of a thickness of the chip.

4. The semiconductor package of claim 3, wherein the depth of the electrically-conductive wall is equal to at least two-thirds of the thickness of the chip.

5. The semiconductor package of claim 1, wherein the electrically-conductive adhesive is silver paste.

6. The semiconductor package of claim 1, wherein the chip is mounted on the substrate in proximity to the ground plane.

7. The semiconductor package of claim 1, wherein the chip is mounted over the ground plane of the substrate.

8. A semiconductor package method, comprising the steps of:
    preparing a wafer, which is partitioned by a number of predefined singulation lines into a plurality of chips, wherein each of the chips has an active surface formed with a plurality of ground pads and the ground pads on any two adjacent chips disposed across one of the singulation lines are interconnected by a plurality of elongated portions;
    forming a plurality of trenches along the singulation lines on the wafer;
    performing a filling process to fill the trenches with an electrically conductive material being in electrical contact with the elongated portions of the ground pads;
    singulating the wafer along the singulation lines into the electrically-conductive material in the trenches so as to separate each of the chips from the wafer and meanwhile form an electrically-conductive wall attached to the sidewalls of each of the chips;
    performing a die-mounting process to mount at least one of the singulated chips on a front surface of a substrate by means of an electrically-conductive adhesive on the substrate, with the electrically-conductive adhesive being in electrical contact with both the electrically-conductive wall on the sidewall of the chip and a grounding plane on the substrate, so as to electrically connect each ground pad on the chip to the grounding plane on the substrate;
    performing a molding process to form an encapsulation body over the front surface of the substrate for encapsulating the chip; and
    performing a ball-implantation process to implant a plurality of solder bails on ground-ball pads over a back surface of the substrate, allowing the ground pads on the chip to be electrically connected to an external device via the solder balls implanted on the ground-ball pads on the substrate.

9. The semiconductor packaging method of claim 8, wherein each pair of opposite ground pads on adjacent chips on the wafer are interconnected with each other by means of a continuous electrically-conductive trace crossing the singulation line.

10. The semiconductor packaging method of claim 8, wherein the depth of the electrically-conductive wall is at least greater than one half of a thickness of the chip.

11. The semiconductor packaging method of claim 8, wherein the depth of the electrically-conductive wall is at least two-thirds of the thickness of the chip.

12. The semiconductor packaging method of claim 8, wherein the electrically conductive material fill process includes the substeps of:

performing a dispensing process to dispense a curable flowable electrically-conductive substance into the trenches on the front surface of the wafer; and performing a baking process to cure the electrically-conductive material in the trenches.

13. The semiconductor packaging method of claim 8, wherein the electrically-conductive adhesive is silver paste.

14. The semiconductor packaging method of claim 8, wherein the chip is mounted on the substrate in proximity to the grounding plane.

15. The semiconductor packaging method of claim 8, wherein the chip is mounted over the grounding plane of the substrate.

16. A semiconductor packaging method, comprising the steps of:

preparing a wafer, which is partitioned by a number of predefined singulation lines into a plurality of chips, wherein each of the chips has an active surface formed with a plurality of ground pads and the ground pads on any two adjacent chips disposed across one of the singulation lines are interconnected by a plurality of elongated portions;

forming a plurality of trenches along the singulation lines on the wafer;

performing a filling process to fill the trenches with an electrically conductive material being in electrical contact with the elongated portions of the ground pads;

singulating the wafer along the singulation lines into the electrically-conductive material in the trenches so as to separate each of the chips from the wafer and meanwhile form an electrically-conductive wall attached to the sidewalls of each of the chips;

performing a disposing process to dispose a curable electrically-conductive material into the trenches, and then baking the curable electrically-conductive material in the trenches, so as to allow the curable electrically-conductive material to come into electrical contact with the elongated portions of the ground pads;

performing a die-mounting process to mount at least one of the singulated chips on a front surface of a substrate by means of an electrically-conductive adhesive on the substrate, with the electrically-conductive adhesive being in electrical contact with both the electrically-conductive wall on the sidewall of the chip and a grounding plane on the substrate, so as to electrically connect each ground pad on the chip to the grounding plane on the substrate;

performing a molding process to form an encapsulation body over the front surface of the substrate for encapsulating the chip; and performing a ball-implantation process to implant a plurality, of solder balls on ground-ball pads over a back surface of the substrate, allowing the ground pads on the chip to be electrically connected to an external device via the solder balls implanted on the ground-ball pads on the substrate.

17. The semiconductor packaging method of claim 16, wherein the depth of the electrically-conductive wall is greater than one half of the thickness of the chip.

18. The semiconductor packaging method of claim 16, wherein the chip is mounted in proximity to the grounding plane.

19. The semiconductor packaging method of claim 18, wherein the chip is mounted over the grounding plane.

\* \* \* \* \*

UNITED STATES PATENT AND TRADEMARK OFFICE
CERTIFICATE OF CORRECTION

PATENT NO. : 6,903,441 B2
APPLICATION NO. : 10/452566
DATED : June 7, 2005
INVENTOR(S) : Wang et al.

It is certified that error appears in the above-identified patent and that said Letters Patent is hereby corrected as shown below:

<u>Column 3,</u>
Line 4, delete "showing-a" and insert -- showing a --.

<u>Column 4,</u>
Line 38, delete "groundpads" and insert -- ground pads --.

<u>Column 5,</u>
Line 40, delete "ground around plane" and insert -- ground plane --.

<u>Column 6,</u>
Line 51, delete "bails" and insert -- balls --.

<u>Column 8,</u>
Line 20, delete "plurality," and insert -- plurality --.

Signed and Sealed this

Twentieth Day of June, 2006

JON W. DUDAS
*Director of the United States Patent and Trademark Office*